(12) United States Patent
Lesea et al.

(10) Patent No.: US 7,525,362 B1
(45) Date of Patent: Apr. 28, 2009

(54) CIRCUIT FOR AND METHOD OF PREVENTING AN ERROR IN A FLIP-FLOP

(75) Inventors: Austin H. Lesea, Los Gatos, CA (US); Tan Canh Hoang, Ontario, CA (US)

(73) Assignee: Xilinx, Inc., San Jose, CA (US)

( * ) Notice: Subject to any disclaimer, the term of this patent is extended or adjusted under 35 U.S.C. 154(b) by 335 days.

(21) Appl. No.: 11/377,961

(22) Filed: Mar. 17, 2006

(51) Int. Cl.
*H03K 3/356* (2006.01)

(52) U.S. Cl. .................. 327/208; 327/212

(58) Field of Classification Search ......... 327/208–212, 327/199, 214
See application file for complete search history.

(56) References Cited

U.S. PATENT DOCUMENTS

| | | | |
|---|---|---|---|
| 5,025,174 A * | 6/1991 | Shikata | 327/203 |
| 6,563,356 B2 * | 5/2003 | Fulkerson | 327/203 |
| 6,566,927 B2 * | 5/2003 | Park et al. | 327/211 |
| 6,696,847 B1 | 2/2004 | LaFontaine et al. | |
| 6,864,732 B2 * | 3/2005 | Chalasani | 327/203 |
| 7,038,515 B2 * | 5/2006 | Rusu et al. | 327/208 |

* cited by examiner

*Primary Examiner*—Lincoln Donovan
*Assistant Examiner*—Hai L. Nguyen
(74) *Attorney, Agent, or Firm*—John J. King; Justin Liu

(57) ABSTRACT

A circuit for preventing an error in a flip-flop is disclosed. The circuit comprises an input circuit for receiving input data; a circuit for generating true and complement data associated with each of the input data and redundant data at predetermined nodes of the circuit; and a plurality of inverters each controlled by an associated node, wherein an inverter node of each inverter of the plurality of inverters is coupled to a separate node of the predetermined nodes. A method of preventing an error in a flip-flop is also disclosed.

17 Claims, 4 Drawing Sheets

-- Prior Art --

CIRCUIT FOR AND METHOD OF PREVENTING AN ERROR IN A FLIP-FLOP

FIELD OF THE INVENTION

The present invention relates generally to integrated circuits, and in particular, to a circuit for and a method of preventing an error in a flip-flop.

BACKGROUND OF THE INVENTION

Boolean gates, which may be implemented using transistors, form a basic element of many integrated circuits. For example, when the gates are properly implemented, they will retain an input value, and therefore enable the storage of data. This simple concept is the basis of a random access memory (RAM), and also makes it possible to create a wide variety of other useful circuits. For example, flip-flops, which are well known in the art, are also created from predetermined arrangements of gates and enable a variety of functions to be implemented in an integrated circuit. For example, flip-flops may be used in shift registers, counters, frequency dividers and sequence detectors, among a number of other applications.

However, certain flip-flops may encounter a problem with unintended oscillation. One way of overcoming the problem of oscillation is to use two back-to-back flip-flops, commonly called a master-slave flip-flop. An example of a conventional master-slave flip-flop is shown in FIG. 1. In particular, a master flip-flop 102 and a slave flip-flop 104 receive clock signals generated by a pair of inverters 106 and 108. The master flip-flop 102 comprises a first tri-state buffer 110, which receives an input data signal D, and an inverter 112. The output of the inverter is coupled to a second tri-state buffer 114 to create a latch. The output of the inverter 112 is also coupled to a first tri-state buffer 116 of the slave flip-flop 104. The first tri-state buffer 116 of the slave flip-flop 104 is coupled to an inverter 118, the output of which is coupled to a second tri-state buffer 120 of the slave flip-flop 104 to create a latch for the slave flip-flop. The output of the tri-state buffer 120 is coupled to an inverter 122, which generates an output signal Q.

In a master-slave flip-flop, the master flip-flop operates as an input latch, while the output is slaved to the master during a half of each clock cycle. An important feature of a master-slave-flip-flop is that the complement of the clock pulse is fed to the slave flip-flop. Therefore, the outputs from the master flip-flop are only "seen" by the slave flip-flop when the clock signal is high. That is, on the low-to-high transition of the clock, the outputs of the master are fed through the slave flip-flop. By employing an edge-triggered master-slave flip-flop, the moment when all flip-flops change state may be controlled.

One commonly used flip-flop is the J-K flip-flop. A J-K flip-flop may perform the function of other conventional flip-flops, such as D, R-S or T type flip-flops. It has the input-following characteristics of a clocked D flip-flop, but has two inputs, traditionally labeled J and K. If J and K are different, then the output Q takes the value of J at the next clock edge. If J and K are both low, then no change occurs. If J and K inputs are both high at the clock edge, then the output will toggle from one state to the other. A J-K flip-flop may perform the functions of the set/reset flip-flop and has the advantage that there are no ambiguous states. Finally, a J-K flip-flop may also act as a T flip-flop to accomplish toggling action if the J and K inputs are tied together. J-K flip-flops are also often configured as master-slave flip-flops in order to overcome the problem with oscillation. Accordingly, the single change of state may occur when J=K=1, preventing oscillation between states Q=0 and Q=1 at successive clock pulses.

One category of integrated circuits which often employs flip-flops is a programmable logic device (PLD). A PLD is designed to be user-programmable so that users may implement logic designs of their choices. Programmable logic circuits of a PLD comprise gates which are configurable by a user of the circuit to implement a desired circuit design. One type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. However, an error in the configuration memory cells may cause the PLD to function improperly. When a circuit enabling error correction is implemented in a programmable logic device, the programmable logic device does not have to be completely reconfigured, possibly causing many seconds of system downtime.

Certain applications of programmable logic devices, such as military, aerospace, and high-reliability communications, require detection of errors even when the likelihood of such an occurrence is extremely low. Furthermore, applications running in redundant systems require fast indication of a single event upset (SEU) in order to minimize the impact upon operation. In many cases, fast correction with minimal impact upon operation is also required. Even the rare SEU must be detected for some high-reliability systems so that appropriate system measures may be taken to ensure very high uptime. In certain applications, automatic correction of errors may also be a significant advantage. When processing real-time streaming data such as a video signal, for example, automatic correction of errors allows operation to continue without the need for a system reset. Among other benefits, the correction of errors in circuits allows much faster system recovery time of a programmable logic device.

Accordingly, there is a need for an improved circuit for and method of preventing an error in a flip-flop.

SUMMARY OF THE INVENTION

A circuit for preventing an error in a flip-flop is disclosed. The circuit comprises an input circuit for receiving input data; a circuit for generating true and complement data associated with input data at predetermined nodes of the circuit; and a plurality of inverters each controlled by an associated node, wherein an inverter node of each inverter of the plurality of inverters is coupled to a separate node of the predetermined nodes. The circuit preferably receives redundant data by inverting input data to create redundant data or having a separate input for receiving the redundant data. Further, a circuit generating true and complement data may be implemented using a plurality of pass gates or a plurality tri-state buffers, each coupled to the input data or the redundant data. Finally, the plurality of inverters comprises a plurality of transistor pairs or an inverter based on a dynamic latch having four transistors.

According to an alternate embodiment, a flip-flop circuit having a self-correction capability comprises an input circuit for receiving input data; a plurality of pass gates for generating true and complement data associated with the input data at predetermined nodes of the circuit; and a plurality of inverters each comprising four transistors and controlled by an associated node of the predetermined nodes, wherein an inverter node of each inverter of the plurality of inverters is coupled to a separate node of the predetermined nodes. The plurality of pass gates may comprise pairs of transistors, for example, where each pair of transistors is coupled to control a first transistor of an inverter. Each inverter node of the plurality of inverters may also be coupled to control a transistor of another inverter. Finally, the circuit may comprise a master-slave flip-flop implemented in programmable logic.

A method of preventing an error in a flip-flop is also disclosed. The method comprises steps of providing nodes of the flip-flop for redundant data; selectively coupling each primary node and each redundant node of the flip-flop to a plurality of inverters; and resetting a node of the flip-flop when data on the node is corrupted. The step of resetting a node of the flip-flop may comprise a step of coupling an inverter of a plurality of inverters to each primary node and redundant node. Further, primary nodes may be reset with data of a redundant node, or redundant nodes reset with data of a primary node.

DETAILED DESCRIPTION OF THE DRAWINGS

Figure 1:
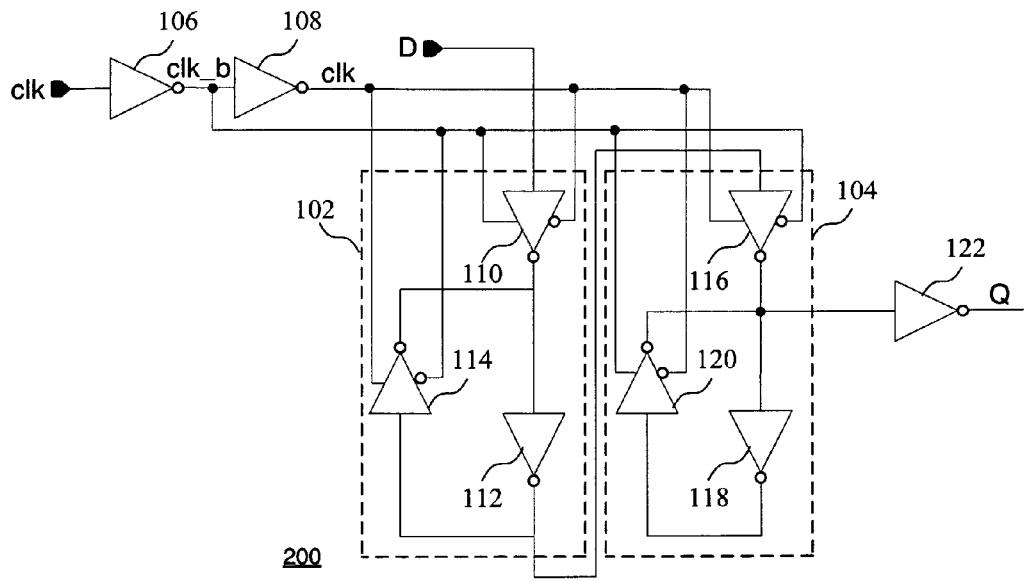
FIG. 1 is a block diagram of a conventional master-slave flip-flop.
Figure 2:
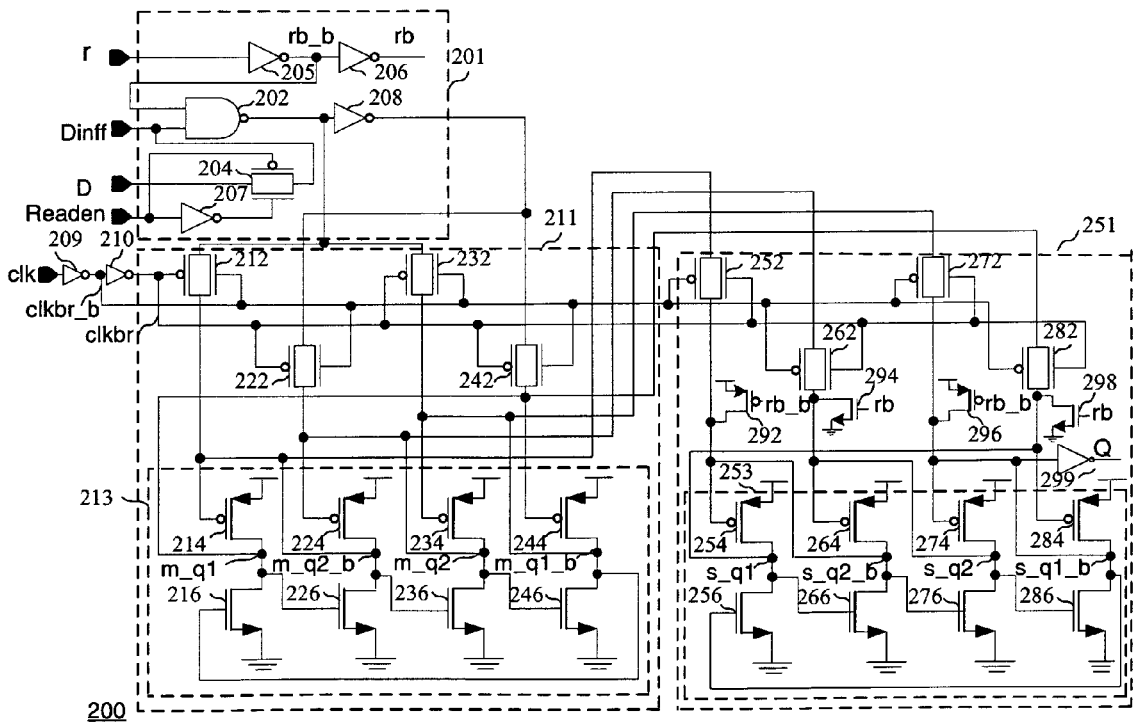
FIG. 2 is a block diagram of a master-slave flip-flop employing pass gates and inverters for latching an input signal according to an embodiment of the present invention.

Turning first to FIG. 2, a block diagram of a master-slave flip-flop employing pass gates and inverters for latching an input signal according to an embodiment of the present invention is shown. In particular, a input circuit 201 comprises a NAND gate 202 for receiving a data signal D by way of a pass gate 204 and an inverted reset signal rb_b output by way of an inverter 205, which is also coupled to an inverter 206 for generating a (buffered) reset signal rb. The pass gate 204 is controlled by a read enable (Readen) signal and an inverted read enable signal coupled to the pass gate by way of an inverter 207. The circuit of FIG. 2 enables preventing corrupted data by adding a redundant data signal to generate two true data nodes and two complement data nodes to the master section of the flip-flop. The redundant data signal may be generated, for example, by generating an inverted input signal. Accordingly, the output of the NAND gate 202 is coupled to an inverter 208. A clock signal is coupled to an inverter 209 which generates an inverted clock signal clkbr_b which is coupled to a second inverter 210 which generates the clkbr signal. The output of the NAND gate 202 and the inverted output generated by the inverter 208 are coupled to a master flip-flop 211 to control various paths of the master flip-flop. In particular, the output of the NAND gate 202 is coupled to a pass gate 212, comprising a pair of transistors which are controlled by a clock and inverted clock signal, clkbr and clkbr_b, respectively. The output of the pass gate 212 is coupled to an inverter circuit 213 having a plurality of inverters comprising complementary p-channel and n-channel transistors. In particular, the output of the pass gate 212 is coupled to a gate of an associated p-channel transistor 214 having a source pulled high and a drain coupled to a drain of an n-channel transistor 216 which has a source coupled to ground. The node at the connection of the drain of transistor 214 and the drain of transistor 216 comprises an inverter node. The gate of transistor 216 is controlled by an inverter node of another path of the master section, as will be described in more detail below. The output of the inverter 208 is coupled to a pass gate 222 of a second stage. The pass gate 222 also comprises a pair of transistors and has an output coupled to an associated inverter comprising a transistor 224 and a transistor 226. The output of the pass gate 222 is coupled to the gate of the transistor 224 which has a source pulled high and a drain coupled to the drain of the transistor 226. The gate of transistor 226 is coupled to receive the signal at the inverter node of a separate inverter (i.e., the node between transistors 214 and 216).

Two additional stages also receive the output of the NAND gate 202 and inverter 208. In addition to generating m_q1 and m_q1_b signals at primary nodes as in a conventional circuit (both of which are based upon the output of inverter 208), redundant data is used to generate m_q2 and m_q2_b signals at redundant nodes (both of which are based upon the output of NAND gate 202), as will be described in more detail below. In particular, the output of the NAND gate 202 is coupled to a pass gate 232 comprising a pair of transistors. The output of the pass gate 232 is coupled to a gate of an associated transistor 234 having a source pulled high and a drain coupled to a drain of a transistor 236 which has a source coupled to ground. The gate of the transistor 236 is coupled to receive the signal at the inverter node of a separate inverter (i.e., the node between transistors 224 and 226). Finally, the output of the inverter 208 is coupled to a pass gate 242 of a second stage. The pass gate 242 also comprises a pair of transistors and has an output coupled to an inverter comprising a transistor 244 and a transistor 246. The output of the pass gate 242 is coupled to the gate of the transistor 244 which has a source pulled high and a drain coupled to the drain of the transistor 246. The gate of transistor 246 is coupled to receive the signal at the inverter node between transistors 234 and 236. The inverter node at the drains of the transistors 244 and 246 is also coupled to control the gate of transistor 216.

The inverters of the four stages in the master flip-flop, whose gates and drains are selectively connected to the true and complement data lines through the pass gates, enable resetting the data of the various nodes in the event of an error. While the affected input data line or the internal nodes in the master and slave circuits of the flip-flop will flip to the opposite state and cause incorrect data, which would be transferred to the next stage in the following logic in a conventional circuit, each inverter of the circuit of FIG. 2 is controlled by an associated node, and an inverter node of each inverter is coupled to a separate node to reset the separate node. The drain of transistors 214 and 216 are coupled to the output of the pass gate 242, the drains of transistors 224 and 226 are coupled to the output of the pass gate 212, the drains of the transistors 234 and 236 are coupled to the output of the pass gate 222, and the drains of the transistors 244 and 246 are coupled to the output of the pass gate 232. Thus, if data on m_q2 at the output of pass gate 222 is corrupted, for example, the inverter node between transistors 234 and 236 of a separate inverter will reset the node to the correct value. That is, while the data at the output of pass gate 222 is based upon data at the output of inverter 208, the data at the output of pass gate 232 is based upon data output by NAND gate 202, and therefore will correct the data corrupted if the output of inverter 208 or the pass gate 222 is corrupted. By way of example, if the output of the pass gate 222 should be high (but is changed to a low state due to an error) and the output of the pass gate 232 is low as expected, the low signal at the gate of transistor 234 will pull the node m_q2 high, resetting and correcting the node to a high value. Accordingly, a primary node (e.g., m_q2) is reset by a redundant node (e.g., m_q1_b coupled to the gate of the transistor 234). Any particle striking on any node of the flip-flop at one of the data lines of the master circuit will cause only a temporary upset on that node. The redundant path will reset the affected path and recover the correct data. The self-correcting feature of the inverter circuit 213 enables a master-slave flip-flop to operate in a high radiation environment, such as space, or in other environments that may cause errors. The master flip-flop 211 will work either in the stand-by mode when the clock is idle or in dynamic operation when the clock is running.

The slave flip-flop 251 of the master-slave pair also enables self-correction. The inverters in the slave section also comprise transistors which are selectively connected to the true and complement internal nodes from the master section through pass gates. The data at the outputs of the pass gates 212, 222, 232, and 242 are coupled to the pass gates of the circuit 251. In particular, the output of the pass gate 212 is coupled to a pass gate 252, comprising a pair of transistors which are controlled by a clock and inverted clock signal, clkbr and clkbr_b respectively. The output of the pass gate 252 is coupled to an inverter circuit 253, and in particular a gate of a transistor 254 having a source pulled high and a drain coupled to a drain of a transistor 256 which has a source coupled to ground. The node at the connection of the drain of transistor 254 and the drain of transistor 256 comprises an inverter node. The gate of transistor 256 is controlled by an inverter node of another path of the slave flip-flop, as will be described below. The output of the pass gate 222 is coupled to a pass gate 262 of the slave flip-flop. The pass gate 262 also comprises a pair of transistors and has an output coupled to an inverter comprising a transistor 264 and a transistor 266. The output of the pass gate 262 is coupled to the gate of the transistor 264 which has a source pulled high and a drain coupled to the drain of the transistor 266. The gate of transistor 266 is coupled to receive the signal at the inverter node between transistors 254 and 256.

Two additional stages also receive the output of pass gates of the master flip-flop. In particular, the output of the pass gate 232 is coupled to a pass gate 272, comprising a pair of transistors which are controlled by a clock and inverted clock signal, clkbr and clkbr_b respectively. The output of the pass gate 272 is coupled to a gate of a transistor 274 having a source pulled high and a drain coupled to a drain of a transistor 276 which has a source coupled to ground. The node at the connection of the drain of transistor 274 and the drain of transistor 276 comprises an inverter node. The gate of transistor 276 is controlled by an inverter node of the inverter created by transistors 264 and 266. Finally, the output of pass gate 242 is coupled to a pass gate 282 of the slave flip-flop. The pass gate 282 also comprises a pair of transistors and has an output coupled to an inverter comprising a transistor 284 and a transistor 286. The output of the pass gate 282 is coupled to the gate of the transistor 284 which has a source pulled high and a drain coupled to the drain of the transistor 286. The gate of transistor 286 is coupled to receive the signal at the inverter node between transistors 274 and 276.

The nodes of the inverters of inverter circuit 253 are also coupled to a separate node of the slave flip-flop, as described above with respect to the master flip-flop. In particular, the node at the drains of transistors 254 and 256 are coupled to the output of pass gate 282, the node at the drains of transistors 264 and 266 are coupled to the output of pass gate 252, the node at the drains of transistors 274 and 276 are coupled to the output of pass gate 262, and the node at the drains of transistors 284 and 286 are coupled to the output of pass gate 272. Finally, the rb and rb_b signals are coupled to the gates of transistors 292-298, which are coupled to the outputs of the pass gates 252, 262, 272, and 282, respectively, to reset the slave flip-flop. Accordingly, the circuit of FIG. 2 provides a radiation-hardened master-slave flip-flop, which corrects a single-event upset on the data line in the master circuit and slave circuit. While the circuit may be implemented in any transistor technology, the circuit is preferably implemented in metal oxide semiconductor (MOS) technology having transistors with a gate length less than or equal to 90 nanometers (nm) and having circuit voltages below 1.5 volts, conditions which may lead conventional flip-flops to fail.

Figure 3:
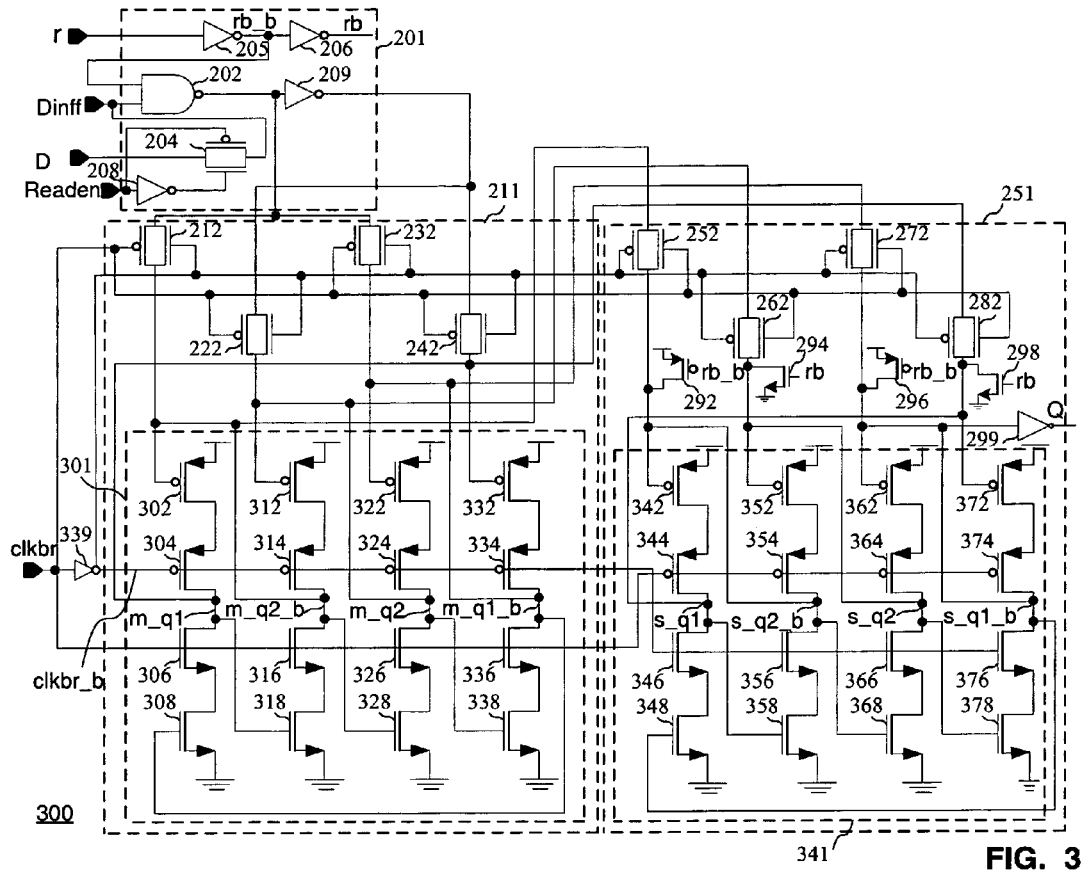
FIG. 3 is a block diagram of a master-slave flip-flop employing pass gates and inverters for latching an input signal according to an alternate embodiment of the present invention.

Turning now to FIG. 3, a block diagram of a master-slave flip-flop employing pass gates and inverters for latching an input signal according to an alternate embodiment of the present invention is shown. As shown in FIG. 3, while the top portion of the circuit remains the same, the inverter circuits 213 and 253 are replaced by inverter circuits 301 and 341, respectively. Depending upon the construction of the integrated circuit and the transistors employed, the ability to set and reset the state of the nodes by the two-transistor inverters of the inverter circuits 213 and 253 may be limited. For example, in a circuit implemented on a wafer manufactured according to 90 nanometer (nm) dimensions, the circuit operates at a very low $V_{dd}$ (e.g., $V_{dd}$ is at 1.2 volts (V) and below), making it difficult to reset all four nodes. Accordingly, four-transistor inverters may be employed as shown in FIG. 3.

The output of pass gate 212 is coupled to a first inverter comprising transistors 302-308. The output of pass gate 212 is coupled to a gate of a p-channel transistor 302 having a source pulled high and a drain coupled to a source of a second p-channel transistor 304. The drain of the transistor 304, which forms the inverter node of an inverter comprising transistors 302-308, is coupled to a drain of an n-channel transistor 306. The source of the transistor 306 is coupled to the drain of a second n-channel transistor 308 having a source coupled to ground. Similarly, the output of pass gate 222 is coupled to a gate of a p-channel transistor 312 having a source pulled high and a drain coupled to a source of a second p-channel transistor 314. The drain of the transistor 314, which forms the inverter node of an inverter comprising transistors 312-318, is coupled to a drain of an n-channel transistor 316. The source of the transistor 316 is coupled to the drain of a second n-channel transistor 318 having a source coupled to ground. Further, the output of pass gate 232 is coupled to a gate of a p-channel transistor 322 having a source pulled high and a drain coupled to a source of a second p-channel transistor 324. The drain of the transistor 324, which forms the inverter node of an inverter comprising transistors 322-328, is coupled to a drain of an n-channel transistor 326. The source of the transistor 326 is coupled to the drain of a second n-channel transistor 328 having a source coupled to ground. Finally, the output of pass gate 242 is coupled to a gate of a p-channel transistor 332 having a source pulled high and a drain coupled to a source of a second p-channel transistor 334. The drain of the transistor 334, which forms the inverter node of an inverter comprising transistors 332-338, is coupled to a drain of an n-channel transistor 336. The source of the transistor 336 is coupled to the drain of a second n-channel transistor 338 having a source coupled to ground.

While each of the top transistors of the plurality of transistors are controlled by the output of an associated pass gate, the second and third transistors of each inverter are controlled by clkbr_b signal output by an inverter 339 and a clkbr signal coupled to the input of the inverter 339, respectively. Finally, the bottom transistor of each inverter is controlled by the output of an inverter node of a separate inverter. In particular, the gate of transistor 308 is controlled by the m_q1_b signal at the node between transistors 334 and 336. The gate of transistor 318 is controlled by the m_q1 signal at the node between transistors 304 and 306. The gate of transistor 328 is controlled by the m_q2_b signal at the node between transistors 314 and 316. Finally, the gate of transistor 338 is controlled by the m_q2 signal at the node between transistors 324 and 326. The nodes of the inverters are also coupled to an output of separate pass gate to reset the nodes as described above.

The slave flip-flop operates in a similar manner. The output of pass gate 252 is coupled to a first inverter comprising transistors 342-348. That is, the output of pass gate 252 is coupled to a gate of a p-channel transistor 342 having a source pulled high and a drain coupled to a source of a second p-channel transistor 344. The drain of the transistor 344, which forms the inverter node of an inverter comprising transistors 342-348, is coupled to a drain of an n-channel transistor 346. The source of the transistor 346 is coupled to the drain of a second n-channel transistor 348 having a source coupled to ground. Similarly, the output of pass gate 262 is coupled to a gate of a p-channel transistor 352 having a source pulled high and a drain coupled to a source of a second p-channel transistor 354. The drain of the transistor 354, which forms the inverter node of an inverter comprising transistors 352-358, is coupled to a drain of an n-channel transistor 356. The source of the transistor 356 is coupled to the drain of a second n-channel transistor 358 having a source coupled to ground. Further, the output of pass gate 272 is coupled to a gate of a p-channel transistor 362 having a source pulled high and a drain coupled to a source of a second p-channel transistor 364. The output of the transistor 364, which forms the inverter node of inverter comprising transistors 362-368, is coupled to a drain of an n-channel transistor 366. The source of the transistor 366 is coupled to the drain of a second n-channel transistor 368 having a source coupled to ground. Finally, the output of pass gate 282 is coupled to a gate of a p-channel transistor 372 having a source pulled high and a drain coupled to a source of a second p-channel transistor 374. The drain of the transistor 374, which forms the inverter node of an inverter comprising transistors 372-378, is coupled to a drain of an n-channel transistor 376. The source of the transistor 376 is coupled to the drain of a second n-channel transistor 378 having a source coupled to ground.

Figure 4:
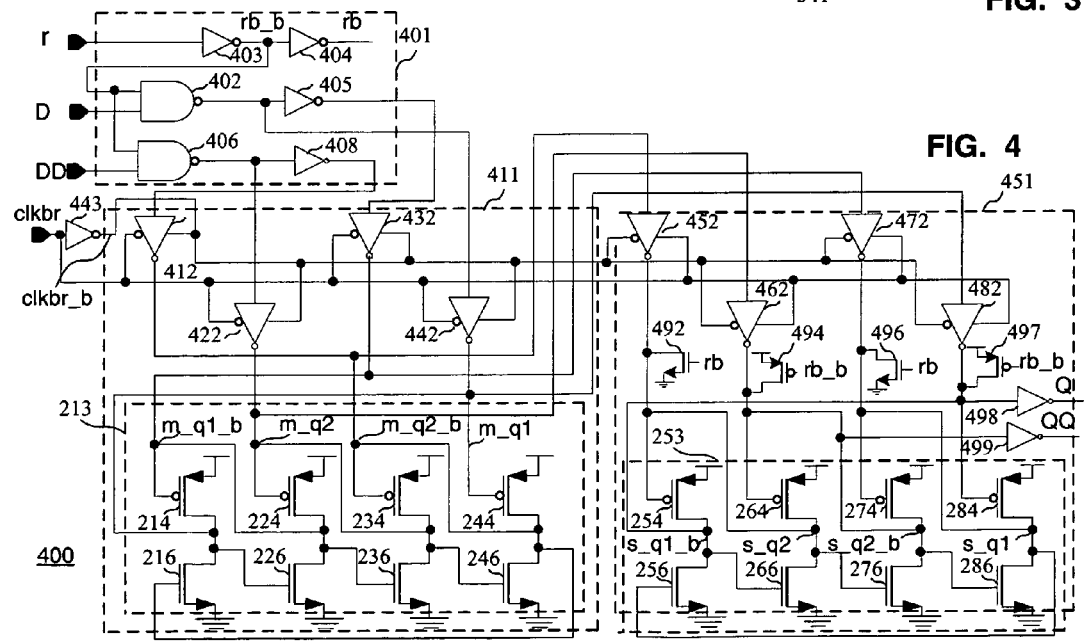
FIG. 4 is a block diagram of a master-slave flip-flop employing tri-state buffers and inverters for latching an input signal according to an embodiment of the present invention.

Turning now to FIG. 4 is a block diagram of a master-slave flip-flop employing tri-state buffers and inverters for latching an input signal according to an embodiment of the present invention is shown. According to the embodiment of FIG. 4, two input data lines are employed to create the redundant signals necessary to correct errors as described above. By selectively connecting the transistors of the inverters, the circuit of FIG. 4 has a redundant path so that if either data line is affected by the neutron particle, for example, the other data path still may provide the valid data. That is, if any node of the master circuit is hit by a neutron particle, the master circuit still may recover. Accordingly, the embodiment of FIG. 4 comprises an input circuit having two separate inputs for receiving redundant inputs D and DD. A first NAND gate 402 is coupled to receive a first data input signal D and the output of an inverter 403, which receives a reset signal r and outputs an inverted reset signal rb_b. The inverter 403 is also coupled to an inverter 404 which generates the rb signal, which will be described in more detail below. The output of the NAND gate 402 is coupled to an inverter 405. A second NAND gate 406 is coupled to receive a redundant data input signal DD, and generates an output which is coupled to an inverter 408. The outputs of the NAND gates 402 and 406 and inverters 405 and 408 used to generate the signals m_q1, m_q1_b, m_q2 and m_q2_b at the nodes as described above. In this circuit, the primary nodes m_q1 and m_q2 are based upon the output of the NAND gates 402 and 406, respectively, while the redundant nodes m_q1_b and m_q2_b are based upon the outputs of inverters 405 and 408, respectively. Accordingly, the true data is based upon redundant input signals while the complement data is separately generated by inverting both redundant inputs. As should be apparent, the additional NAND gate receiving the redundant data signal improves the self-correcting ability of the circuit by providing four distinct data inputs to the flip-flop.

The embodiment of FIG. 4 also employs tri-state buffers in place of the pass gates of the embodiments of FIGS. 2 and 3. In particular, a master slave flip-flop comprises a first tri-state buffer 412 which is coupled to receive the output of the inverter 408 and is coupled to the gate of transistor 234 of the inverter circuit 213, described above in reference to FIG. 2. A second tri-state buffer 422, coupled to receive the output of NAND gate 406, is coupled to the gate of transistor 224. A third tri-state buffer 432, coupled to receive the output of inverter 405, is coupled to the gate of transistor 214. A fourth tri-state buffer 442, coupled to receive the output of NAND gate 402, is coupled to the gate of transistor 244. The operation of the inverter circuit 213 is the same as described in reference to FIG. 2. The tri-state buffers are clocked by a clock signal clkbr coupled to an inverter 443 which outputs an inverted clock signal clkbr_b.

Similarly, the slave flip-flop comprises a first tri-state buffer 452 is coupled to receive the output of tri-state buffer 412 and is coupled to the gate of transistor 254 of the inverter circuit 253, described above in reference to FIG. 2. A second tri-state buffer 462, coupled to receive the output of tri-state buffer 422, is coupled to the gate of transistor 264. A third tri-state buffer 472, coupled to receive the output of tri-state buffer 432, is coupled to the gate of transistor 274. Finally, a fourth tri-state buffer 482, coupled to receive the output of tri-state buffer 442, is coupled to the gate of transistor 284. The rb and rb_b signals are coupled to the gates of transistors 492-497, which are coupled to the outputs of the pass gates 452, 462, 472, and 482, respectively, to reset the nodes of the slave flip-flop. Separate outputs Q and QQ corresponding to the inputs D and DD are output by inverters 498 and 499, respectively. While the circuit of FIG. 4 comprises inverters having pairs of transistors in circuits 213 and 253 as described in reference to FIG. 2, the circuit of FIG. 4 may also employ the inverter circuits 301 and 341 of FIG. 3. Similarly, while the embodiments of FIGS. 2 and 3 employ a single input for receiving single input signal D, the circuits of FIGS. 2 and 3 may employ the input circuit 401 of FIG. 4 having redundant inputs D and DD. According to one benefit of the circuits of FIGS. 2-4, the circuits provide a dual rail feature. That is, the nodes are provided with rail-to-rail swings through full tri-state control or through both pull up and pull down devices to set and reset the nodes at once.

Figure 5:
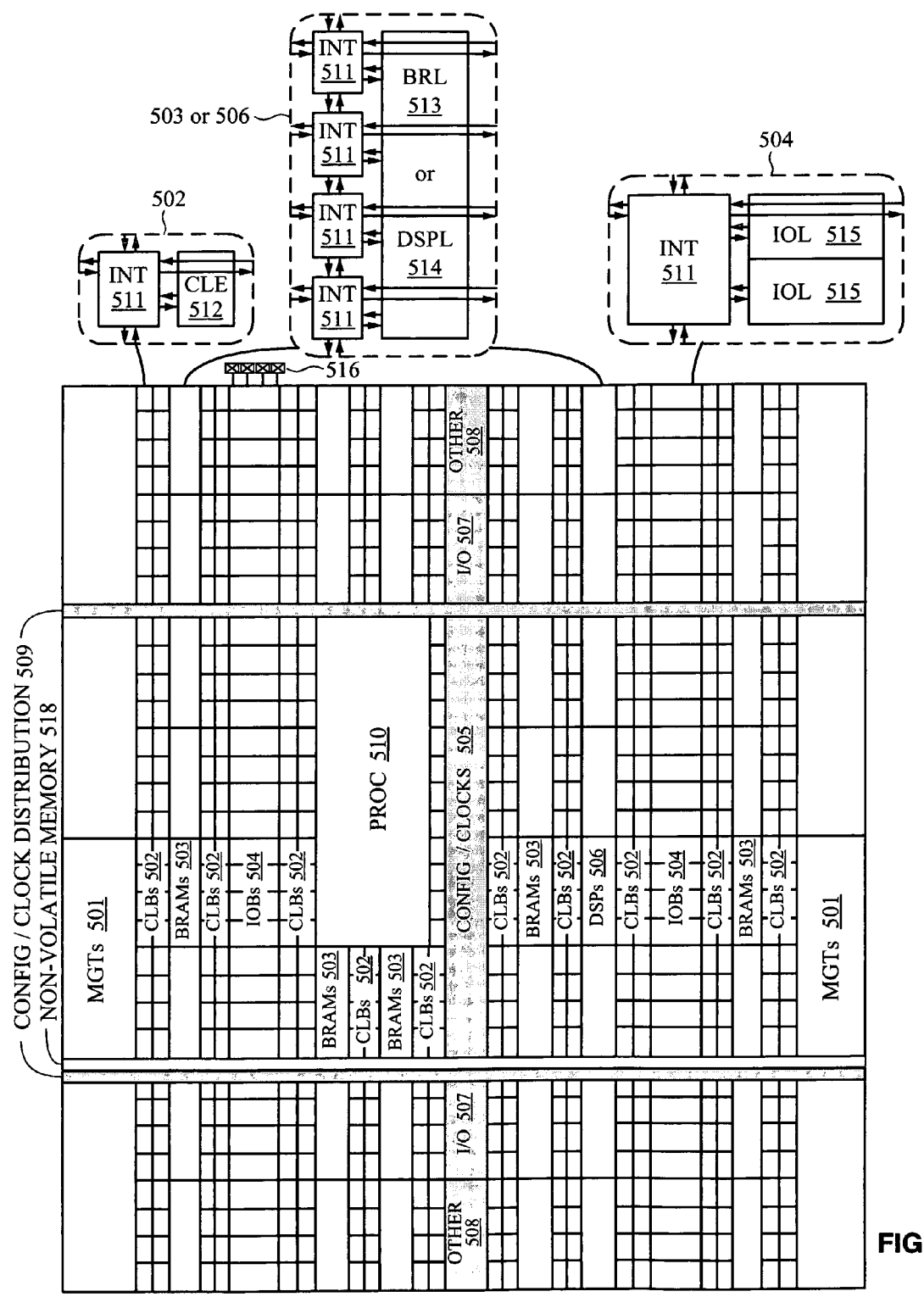
FIG. 5 is a block diagram of a programmable logic device according to an embodiment of the present invention.

Turning now to FIG. 5, a block diagram of a programmable logic device implementing a circuit for preventing an error in a master-slave flip-flop according to an embodiment of the present invention is shown. In particular, advanced FPGAs may include several different types of programmable logic blocks in the array. For example, FIG. 5 illustrates an FPGA architecture 500 that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include one or more dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 may include a configurable logic element (CLE 512) that may be programmed to implement user logic plus a single programmable interconnect element (INT 511). A BRAM 503 may include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 506 may include a DSP logic element (DSPL 514) in addition to an appropriate number of programmable interconnect elements. An IOB 504 may include, for example, two instances of an input/output logic element (IOL 515) in addition to one instance of the programmable interconnect element (INT 511). As will be clear to those of skill in the art, the actual I/O pads 516 connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA. Some FPGAs utilizing the architecture illustrated in FIG. 5 include additional logic blocks that disrupt the regular columnar structure making up a large part of the FPGA. The additional logic blocks may be programmable blocks and/or dedicated logic. For example, the processor block PROC 510 shown in FIG. 5 spans several columns of CLBs and BRAMs. Finally, a non-volatile memory 518 may be employed for on-chip storage of configuration data which is used to configure the configuration logic blocks or other programmable tiles as described above.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of programmable logic device, having configuration memory.

Figure 6:
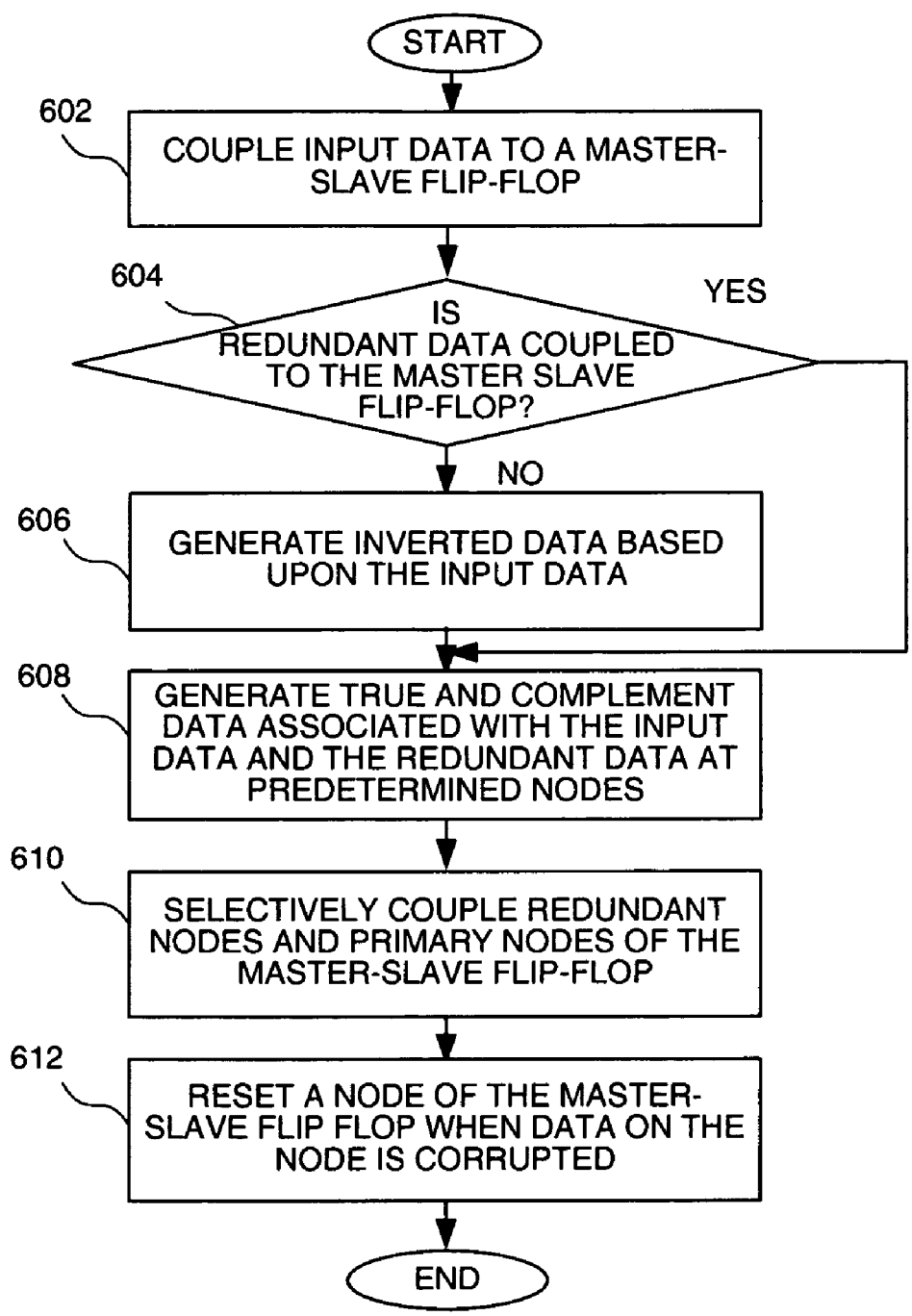
FIG. 6 is a flow chart showing a method of preventing an error in a master-slave flip-flop according to an embodiment the present invention.

Turning now to FIG. 6, a flow chart shows a method of preventing an error in a master-slave flip-flop according to an embodiment the present invention. The method of FIG. 6 may be implemented using the circuits of FIGS. 2-4, for example, or some other suitable circuit. In particular, input data is coupled to a master-slave flip-flop at a step 602. It is then determined whether redundant data is coupled to the master slave flip-flop at a step 604. If not, inverted data is generated based upon the input data at a step 606. True and complement data associated with the input data and the redundant data is generated at predetermined nodes at a step 608. Redundant nodes and primary nodes of the master-slave flip-flop are selectively coupled to a plurality of inverters at a step 610. For example, the nodes may be configured according to the circuits of FIGS. 2-4. A node of the master-slave flip-flop is reset when data on the node is corrupted at a step 612.

It can therefore be appreciated that the new and novel circuit for and method of preventing an error in a master-slave flip-flop has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A circuit for preventing an error in a flip-flop, said circuit comprising:
   an input circuit having a first input for receiving input data and a second input for receiving redundant input data;
   a first data circuit coupled to receive true data and generate complement data associated with said input data at a first pair of predetermined nodes of said circuit;
   a second data circuit coupled to receive true data and generate complement data associated with said redundant input data at a second pair of predetermined nodes of said circuit;
   a plurality of inverters each controlled by an associated node of said first pair of predetermined nodes and said second pair of predetermined nodes, wherein each predetermined node of said first pair of predetermined nodes and said second pair of predetermined nodes is coupled to an inverter node of said plurality of inverters.

2. The circuit of claim 1 wherein said input circuit comprises a first output for outputting said input data and a second output for outputting redundant data.

3. The circuit of claim 1 wherein said data circuit for generating true and complement data comprises a plurality of pass gates.

4. The circuit of claim 1 wherein said data circuit for generating true and complement data comprises a plurality tri-state buffers.

5. The circuit of claim 1 wherein each inverter of said plurality of inverters comprises at least two transistors.

6. The circuit of claim 1 wherein said circuit is implemented with transistors having a gate length of less than or equal to 90 nanometers.

7. A flip-flop circuit having a self-correction capability, said flip-flop circuit comprising:

an input circuit for receiving input data and redundant input data;

a first plurality of pass gates coupling true and complement data associated with said input data to a first pair of predetermined nodes of said circuit;

a second plurality of pass gates coupling true and complement data associated with said redundant input data to a second pair of predetermined nodes of said circuit;

a plurality of inverters each comprising four transistors and controlled by an associated node of said predetermined nodes, wherein an inverter node of each inverter of said plurality of inverters is coupled to a separate node of said first pair of predetermined nodes and said second pair of predetermined nodes.

8. The flip-flop circuit of claim 7 wherein said input circuit comprises a first output for outputting said input data and a second output for outputting redundant data.

9. The flip-flop circuit of claim 7 further comprising a first output associated with said input data and a second output associated with said redundant input data.

10. The flip-flop circuit of claim 7 wherein each pass gate of said plurality of pass gates comprises a pair of transistors, each pair of transistors being coupled to control a first transistor of an inverter of said plurality of inverters.

11. The flip-flop circuit of claim 7 wherein each inverter of said plurality of inverters is coupled to control a transistor of another inverter.

12. The flip-flop circuit of claim 7 wherein said flip-flop circuit comprises a master-slave flip-flop implemented in programmable logic.

13. A method of preventing an error in a flip-flop, said method comprising the steps of:

receiving input data and redundant input data at said flip-flop;

providing true and complement data associated with said input data;

providing true and complement data associated with said redundant input data;

selectively coupling each of said true and complement data associated with said input data and each of said true and complement data associated with said redundant input data of said flip-flop to an inverter of a plurality of inverters; and resetting a first node of said flip-flop when data on said first node is corrupted.

14. The method of claim 13 wherein said step of providing nodes of said flip-flop comprises a step of generating an inverted data input signal.

15. The method of claim 13 wherein said step of resetting said first node of said nodes of said flip-flop comprises a step of coupling an inverter node of each inverter of said plurality of inverters to a separate primary node or redundant node.

16. The method of claim 15 wherein said step of resetting said first node of said nodes of said flip-flop comprises a step of resetting a primary node based upon data of a redundant node.

17. The method of claim 15 wherein said step of resetting said first node of said nodes of said flip-flop comprises a step of resetting a redundant node based upon data of a primary node.

* * * * *